US011927892B2

(12) United States Patent
Bijnen et al.

(10) Patent No.: US 11,927,892 B2
(45) Date of Patent: Mar. 12, 2024

(54) ALIGNMENT METHOD AND ASSOCIATED ALIGNMENT AND LITHOGRAPHIC APPARATUSES

(71) Applicant: ASML Netherlands B.V., Veldhoven (NL)

(72) Inventors: Franciscus Godefridus Casper Bijnen, Valkenswaard (NL); Edo Maria Hulsebos, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/784,424

(22) PCT Filed: Nov. 17, 2020

(86) PCT No.: PCT/EP2020/082364
§ 371 (c)(1),
(2) Date: Jun. 10, 2022

(87) PCT Pub. No.: WO2021/115735
PCT Pub. Date: Jun. 17, 2021

(65) Prior Publication Data
US 2023/0004097 A1    Jan. 5, 2023

(30) Foreign Application Priority Data

Dec. 12, 2019   (EP) .................................. 19215490

(51) Int. Cl.
*G03F 9/00*    (2006.01)
(52) U.S. Cl.
CPC .......... *G03F 9/7088* (2013.01); *G03F 9/7076* (2013.01); *G03F 9/7084* (2013.01); *G03F 9/7092* (2013.01)

(58) Field of Classification Search
CPC .... G03F 9/7076; G03F 9/7084; G03F 9/7088; G03F 9/7092
See application file for complete search history.

(56) References Cited

U.S. PATENT DOCUMENTS 6,537,836 B2 * 3/2003 Summerer ............ H01L 21/681
257/E23.179
6,950,784 B2    9/2005 Summerer
(Continued)

FOREIGN PATENT DOCUMENTS

JP    2006-278799 A    10/2006
TW        449785 B     8/2001
(Continued)

OTHER PUBLICATIONS

International Search Report and Written Opinion of the International Searching Authority directed to related International Patent Application No. PCT/EP2020/082364, dated Mar. 19, 2021; 12 pages.
(Continued)

*Primary Examiner* — Kevin K Pyo
(74) *Attorney, Agent, or Firm* — Sterne, Kessler, Goldstein & Fox P.L.L.C.

(57) ABSTRACT

Disclosed is a substrate, associated patterning device and a method for measuring a position of the substrate. The method comprises performing an alignment scan of an alignment mark to obtain simultaneously: a first measurement signal detected in a first measurement channel and a second measurement signal detected in a second measurement channel. The first and second measurement signals are processed by subtracting a first direction component of the first measurement signal from a first direction component of the second measurement signal to obtain a first processed signal, the first direction components relating to said first
(Continued)

direction. The position of an alignment mark is determined with respect to the first direction from the first processed signal.

20 Claims, 5 Drawing Sheets

(56) References Cited

U.S. PATENT DOCUMENTS

| | | |
|---|---|---|
| 6,961,116 B2 | 11/2005 | Den Boef et al. |
| 2006/0033921 A1 | 2/2006 | Den Boef et al. |
| 2006/0066855 A1 | 3/2006 | Boef et al. |
| 2009/0195768 A1 | 8/2009 | Bijnen et al. |
| 2010/0123886 A1 | 5/2010 | Bijnen et al. |
| 2010/0201963 A1 | 8/2010 | Cramer et al. |
| 2011/0027704 A1 | 2/2011 | Cramer et al. |
| 2011/0043791 A1 | 2/2011 | Smilde et al. |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2013/0258310 A1 | 10/2013 | Smilde et al. |
| 2013/0271740 A1 | 10/2013 | Quintanilha |
| 2015/0176979 A1 | 6/2015 | Mathijssen et al. |
| 2015/0261097 A1 | 9/2015 | Mathijssen et al. |
| 2015/0355554 A1 | 12/2015 | Mathijssen |
| 2019/0094721 A1 | 3/2019 | Tinnemans et al. |

FOREIGN PATENT DOCUMENTS

| | | |
|---|---|---|
| WO | WO 2009/078708 A1 | 6/2009 |
| WO | WO 2009/106279 A1 | 9/2009 |
| WO | WO 2013/178422 A1 | 12/2013 |
| WO | WO 2015/051970 A1 | 4/2015 |
| WO | WO 2018/114152 A1 | 6/2018 |
| WO | WO 2020/038629 A1 | 2/2020 |

OTHER PUBLICATIONS

International Preliminary Report on Patentability directed to related International Patent Application No. PCT/EP2020/082364, dated May 17, 2022; 9 pages.

Research Disclosure No. 650033, "Alignment mark design and method," May 7, 2018; 3 pages.

* cited by examiner

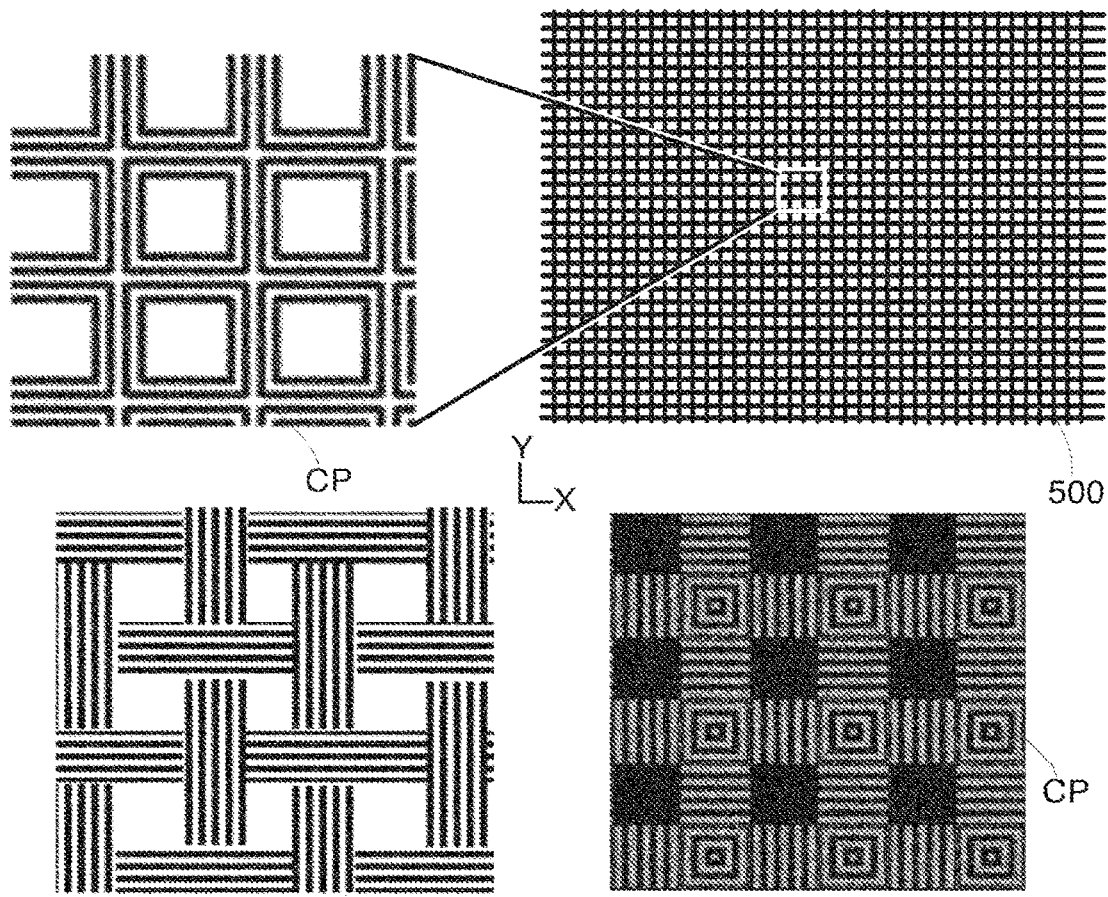
Fig. 5A
Fig. 5B
Fig. 5C
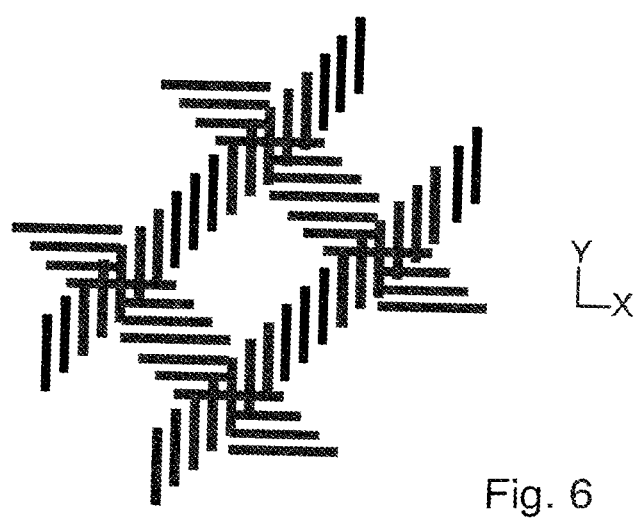
Fig. 6

ALIGNMENT METHOD AND ASSOCIATED ALIGNMENT AND LITHOGRAPHIC APPARATUSES

CROSS-REFERENCE TO RELATED APPLICATION

The application claims priority of EP application 19215490.4 which was filed on Dec. 12, 2019, and which is incorporated herein in its entirety by reference.

FIELD OF THE INVENTION

The present invention relates to methods and apparatus usable, for example, in the manufacture of devices by lithographic techniques, and to methods of manufacturing devices using lithographic techniques. The invention relates to metrology devices, and more specifically metrology devices used for measuring position such as alignment sensors and lithography apparatuses having such an alignment sensor.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In the manufacture of complex devices, typically many lithographic patterning steps are performed, thereby forming functional features in successive layers on the substrate. A critical aspect of performance of the lithographic apparatus is therefore the ability to place the applied pattern correctly and accurately in relation to features laid down (by the same apparatus or a different lithographic apparatus) in previous layers. For this purpose, the substrate is provided with one or more sets of alignment marks. Each mark is a structure whose position can be measured at a later time using a position sensor or alignment sensor (both terms are used synonymously), typically an optical position sensor.

The lithographic apparatus includes one or more alignment sensors by which positions of marks on a substrate can be measured accurately. Different types of marks and different types of alignment sensors are known from different manufacturers and different products of the same manufacturer. A type of sensor widely used in current lithographic apparatus is based on a self-referencing interferometer as described in U.S. Pat. No. 6,961,116 (den Boef et al). Various enhancements and modifications of the position sensor have been developed, for example as disclosed in US2015261097A1. The contents of all of these publications are incorporated herein by reference.

It would be desirable to improve on the alignment marks measured by the alignment sensor, in particular to improve one or more of: the size of the mark (e.g., decrease their size), the scan length over the mark, the speed of measurement of the mark and signal processing of the signal from the mark.

SUMMARY OF THE INVENTION

The invention in a first aspect provides a method of performing a position measurement on an alignment mark comprising at least a first periodic structure having a direction of periodicity along a first direction; the method comprising: performing At least one alignment scan of said alignment mark in a direction other than said first direction or a second direction perpendicular said first direction, to obtain simultaneously: a first measurement signal detected in a first measurement channel and a second measurement signal detected in a second measurement channel, the first measurement signal and second measurement signal each relating to scattered radiation, having been scattered by said alignment mark; processing the first measurement signal and second measurement signal, said processing comprising subtracting a first direction component of the first measurement signal from a first direction component of the second measurement signal to obtain a first processed signal, the first direction components relating to said first direction; and determining a position of an alignment mark with respect to the first direction from the first processed signal.

The invention in a second aspect provides a substrate comprising a plurality of alignment marks, each comprising a first periodic structure having a direction of periodicity along a first direction superimposed with a second periodic structure having a direction of periodicity along a second direction so as to form a two dimensional grid structure; and wherein repeating elements of said first periodic structure and/or second periodic structure are subsegmented to form sub-periodic structure.

Also disclosed is a computer program, metrology apparatus and a lithographic apparatus being operable to perform the method of the second aspect.

The above and other aspects of the invention will be understood from a consideration of the examples described below.

Embodiments of the invention will now be described, by way of example only, with reference to the accompanying drawings, in which:

FIG. 5 depicts FIGS. 5A-5C depict three examples of subsegmented dual direction alignment marks according to embodiments of the invention;

FIG. 6 depicts a further example of a subsegmented dual direction alignment mark according to an embodiment of the invention; FIG. 7A and FIG. 7C example alignment measurement signals captured in respective measurement channels and FIG. 7B and FIG. 7D component signals thereof.

DETAILED DESCRIPTION OF EMBODIMENTS

Before describing embodiments of the invention in detail, it is instructive to present an example environment in which embodiments of the present invention may be implemented.

Figure 1:
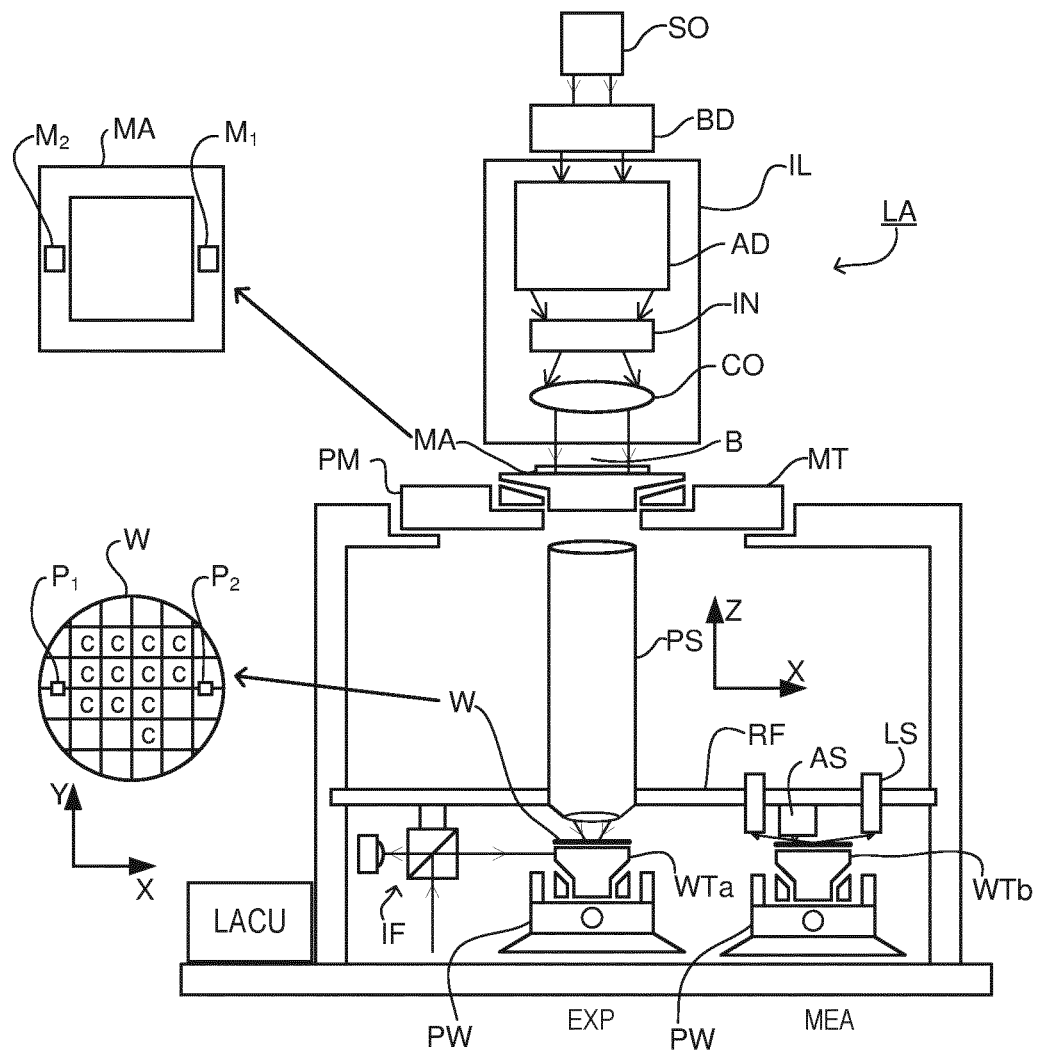
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support MT holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
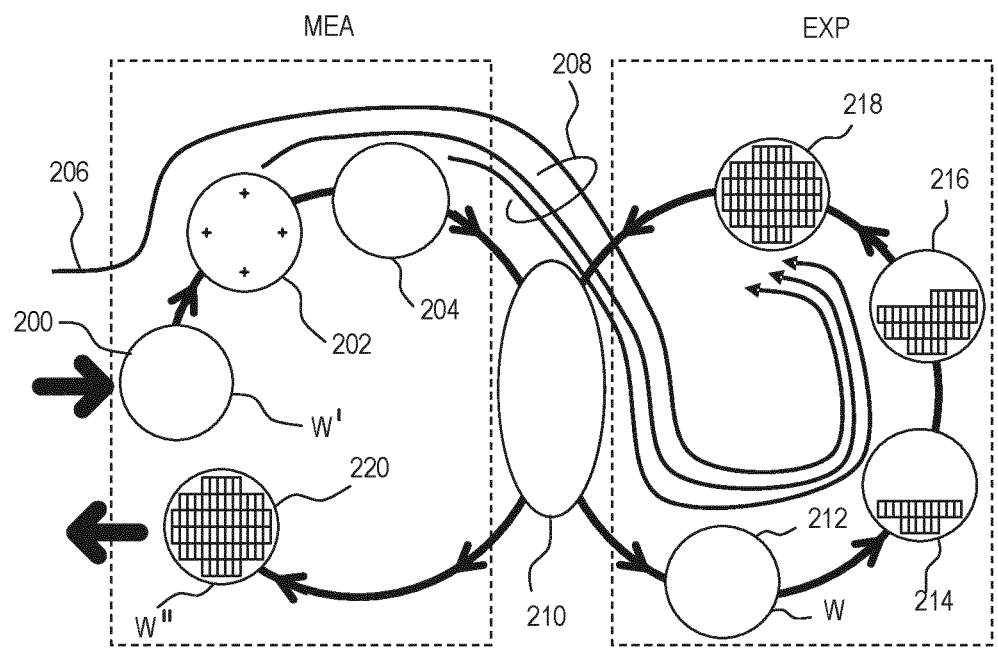
FIG. 2 illustrates schematically measurement and exposure processes in the apparatus of FIG. 1.

FIG. 2 illustrates the steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a "wafer grid", which maps very accurately the distribution of marks across the substrate, including any distortion relative to a nominal rectangular grid.

At step 204, a map of wafer height (Z) against X-Y position is measured also using the level sensor LS. Conventionally, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. To these recipe data are added the measurements of wafer position, wafer grid and height map that were made at 202, 204, so that a complete set of recipe and measurement data 208 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are used to generate an alignment model with parameters that fit the model to the data. These parameters and the alignment model will be used during the exposure operation to correct positions of patterns applied in the current lithographic step. The model in use interpolates positional deviations between the measured positions. A conventional alignment model might comprise four, five or six parameters, together defining translation, rotation and scaling of the 'ideal' grid, in different dimensions. Advanced models are known that use more parameters.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

The skilled person will know that the above description is a simplified overview of a number of very detailed steps involved in one example of a real manufacturing situation. For example rather than measuring alignment in a single pass, often there will be separate phases of coarse and fine measurement, using the same or different marks. The coarse and/or fine alignment measurement steps can be performed before or after the height measurement, or interleaved.

Measuring the position of the marks may also provide information on a deformation of the substrate on which the marks are provided, for example in the form of a wafer grid. Deformation of the substrate may occur by, for example, electrostatic clamping of the substrate to the substrate table and/or heating of the substrate when the substrate is exposed to radiation.

Figure 3:
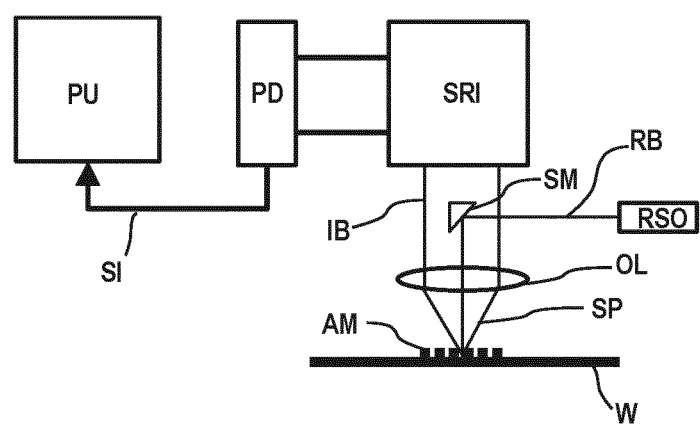
FIG. 3 is a schematic illustration of a first alignment sensor adaptable according to an embodiment.

FIG. 3 is a schematic block diagram of an embodiment of a known alignment sensor AS. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam IB with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam IB comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels are repeated at different wavelengths for increased accuracy and/or for robust detection of the mark irrespective of the materials from which the mark is made, and materials on and/or below which the mark is provided.

A mark, or alignment mark, may comprise a series of bars formed on or in a layer provided on the substrate or formed (directly) in the substrate. The bars may be regularly spaced and act as grating lines so that the mark can be regarded as a diffraction grating with a well-known spatial period (pitch). Depending on the orientation of these grating lines, a mark may be designed to allow measurement of a position along the X axis, or along the Y axis (which is oriented substantially perpendicular to the X axis). A mark comprising bars that are arranged at +45 degrees and/or −45 degrees with respect to both the X- and Y-axes allows for a combined X- and Y-measurement using techniques as described in US2009/195768A, which is incorporated by reference.

The alignment sensor scans each mark optically with a spot of radiation to obtain a periodically varying signal, such as a sine wave. The phase of this signal is analyzed, to determine the position of the mark and, hence, of the substrate relative to the alignment sensor, which, in turn, is fixated relative to a reference frame of a lithographic apparatus. So-called coarse and fine marks may be provided, related to different (coarse and fine) mark dimensions, so that the alignment sensor can distinguish between different cycles of the periodic signal, as well as the exact position (phase) within a cycle. Marks of different pitches may also be used for this purpose.

In performing alignment by measuring the position of alignment marks on the substrate using an alignment sensor, it would be desirable to reduce the area (footprint) of the alignment marks, so that many of them could be accommodated all over the wafer; including in-die, between product structures, where wafer space is "expensive". It is therefore desirable, in a scanning-type alignment sensor (e.g., which scans an underfilled spot over the mark to generate a signal for the SRI), to reduce the length of the required scan length over the mark to maintain sufficient accuracy and reproducibility. In addition, it remains desirable to perform alignment detection simultaneously in X and Y directions (e.g., both directions parallel to the substrate plane), to decrease alignment time and increase throughput.

Figure 4A:
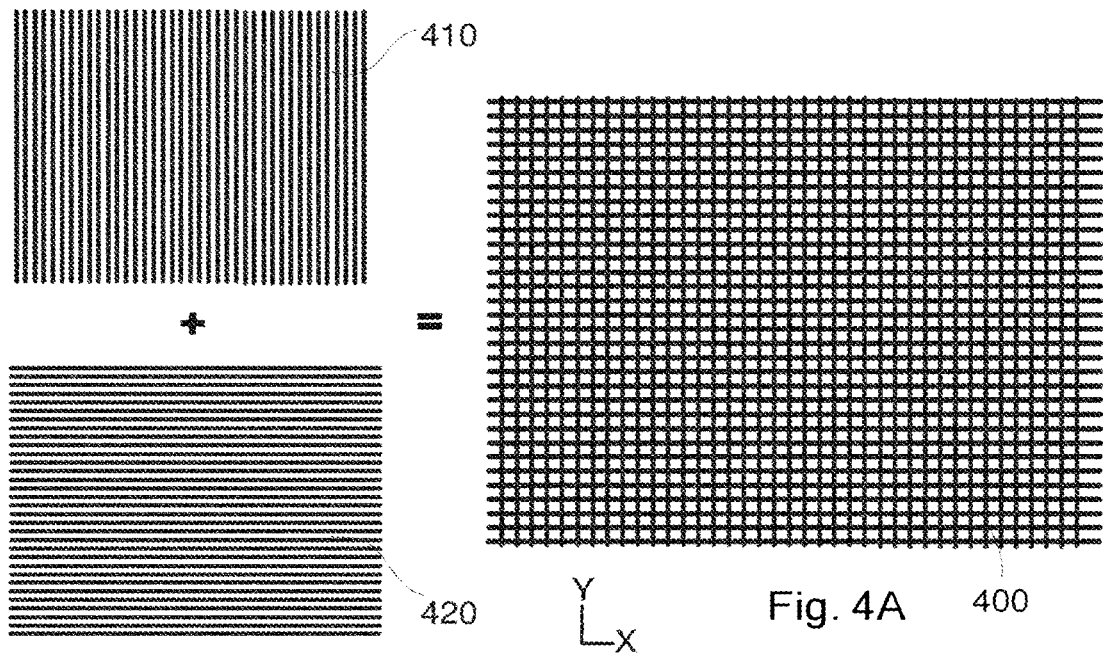
FIGS. 4A-4B depict FIG. 4A a dual direction alignment mark and FIG. 4B measurement thereof.
Figure 4B:
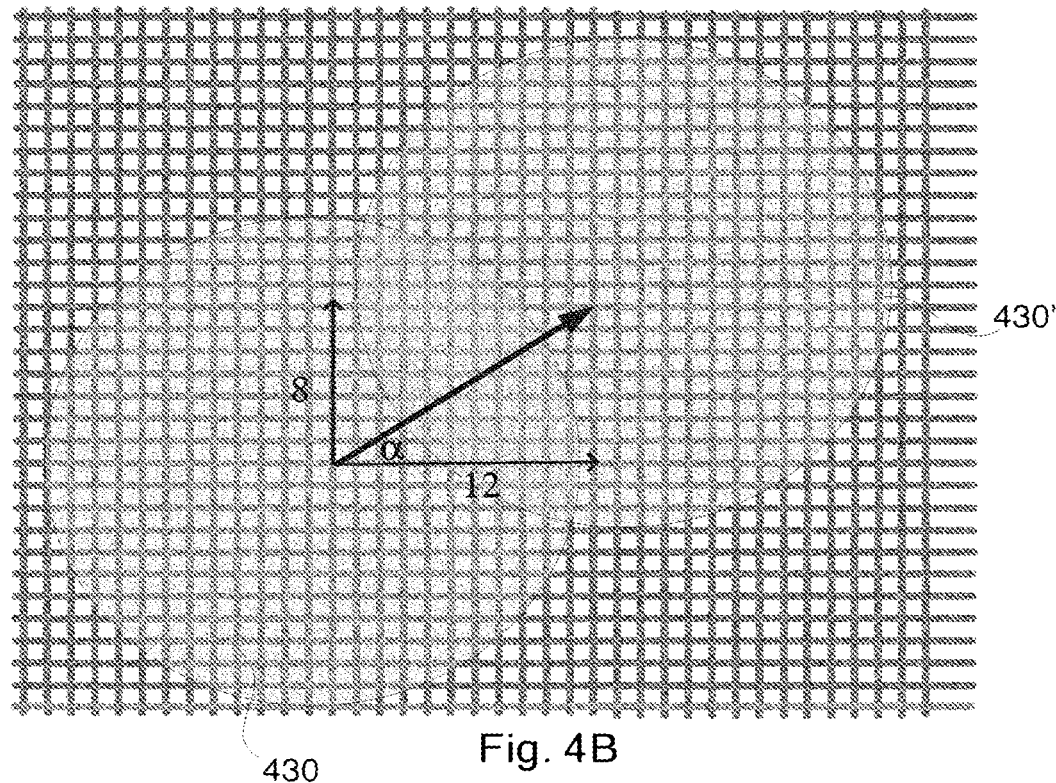

FIG. 4 illustrates one proposal for a small alignment mark with X and Y detectability. This comprises a dual direction mark 400 comprising an X oriented grating 410 effectively superimposed (e.g., overlapped in a single layer) with a Y oriented grating 420. Effectively superimposed in this context describes that the X and Y oriented gratings are not formed separately on the substrate, but will be patterned from a single (grid) pattern on a reticle, in a single exposure step. FIG. 4(b) shows how such a mark may be scanned. A radiation spot of alignment radiation is shown in a first position 430 and a second position 430' during a scan in the direction of the arrow. The physical pitch of the X oriented grating 410 and Y oriented grating 420 are the same in this embodiment, however they could also be different. Whatever the physical pitches, the angle α of the scan (with respect to x) is oblique to enable separation of the X and Y signals, such that each has a different effective detection pitch in the scan direction. Here, the angle α is such that 12 lines are scanned of the X oriented grating 410 during the same time as 8 lines of the Y oriented grating 420 are scanned (e.g., α=33.7 degrees), and therefore the detection pitch ratio X:Y in the scan direction is 2:3.

However, the reproducibility of a dual direction alignment mark 400 is significantly worse than single pitch gratings, mainly due to mixing (cross-talk) between the two effective pitches of the X signal and Y signal. This is particularly the case for a short scan length (e.g., less than 20 µm, less than 15 µm or less than 12 µm) over the alignment mark.

To address this, processing of measurement signals of a measurement scan on an alignment mark in two channels is proposed, the processed signal comprising the difference of corresponding direction components of the two channels. The aligned position can be determined from the processed signal. To provide a difference in signal strength of the corresponding direction components of the two channels, it is optionally proposed to subsegment the alignment mark.

Furthermore, a dual pitch or dual direction (2 dimensional) alignment mark is proposed which comprises subsegmentation. Subsegmentation in this context comprises segmenting the lines of the gratings of each component grating (X grating and Y grating) of the dual direction mark. The subsegmentation may be in both direction of the dual direction mark. In one embodiment, the subsegmentation of a line may be substantially in the same direction as the grating it segments (e.g., in the regions between crossing points where lines of each grating cross). For example, each line of the X direction grating may be segmented in the X direction and each line of the Y direction grating may be segmented in the Y direction. In another embodiment, the subsegmentation may be in the opposite direction as the grating it segments. Crossing points may alternate between X and Y subsegmentation, or each crossing point may include both (e.g., forming a square or X/Y oriented cross or plus + shape). The subsegmentation may have a subsegmentation pitch smaller than 1 µm, smaller than 500 nm, smaller than 300 nm or smaller than 250 nm for example. In another embodiment, it may be that only one direction is subsegmented, with the other direction not subsegmented.

FIG. 5 shows a number of subsegmentation arrangements according to an embodiment. Shown are three subsegmentation types; FIG. 5(a), (b), (c), each of which are shown as detail figures of a dual direction mark 500. In FIGS. 5(a) and 5(b) the subsegmentation of each of the composite X/Y gratings is in the same direction as the grating. FIG. 5(a) shows an arrangement where the crossing points CP of the X/Y gratings from a + or cross shape and in FIG. 5(b) the direction of the subsegmentation alternates (in one direction, here the Y direction) between being X oriented or Y oriented, resembling a "lattice" type arrangement. FIG. 5(c) shows an arrangement where the subsegmentation (between crossing points CP) is in the opposite direction as the grating it segments. Here, the crossing points CP have a subsegmentation which form a square pattern.

The pitch of the subsegmentation (sub-periodic structures) and the number of subsegmented lines formed may vary from the examples shown. In each example, the subsegmentation (each of the sub-periodic structures) comprises 4 to 5 subsegmented lines per main grating line; this may be any number between 2 and 10, for example. Combinations of the arrangements shown are also possible, for example the FIG. 5(b) arrangement may have its subsegmentation in the direction opposite the main gratings in the manner of FIG. 5(c).

It is proposed that the alignment marks of FIG. 5 are measured using an oblique scan (i.e., at an angle not oriented with X or Y). Such an oblique scan may be at or close to the angle α illustrated in FIG. 4, for example.

FIG. 6 shows another embodiment of a dual direction alignment mark with subsegmented grating lines. Here, the main gratings (main pitches) are oriented mutually perpendicular but obliquely with respect to X and Y. The subsegmentation for one grating is oriented with X and for the other grating is oriented with Y. It is proposed that this alignment mark is measured using a scan in the X and/or Y direction. This can be used to determine from a single X or Y scan, the position of one oblique pitch in one channel (e.g., a H polarization channel), the other oblique pitch in the other channel (e.g., a V polarization channel) and combine both signals into an X and a Y signal.

FIG. 7 illustrates a measurement strategy using alignment marks as disclosed herein or otherwise, more specifically any of the marks shown in FIG. 5, scanned in the direction indicated by angle α. The measurement is made using two measurement channels. The measurement channels may relate, for example, to different polarization states or wavelengths; for example a first channel may comprise an H polarization channel and a second channel may comprise a V polarization channel (e.g., with the first and second channels relating to a single wavelength).

Figure 7A:
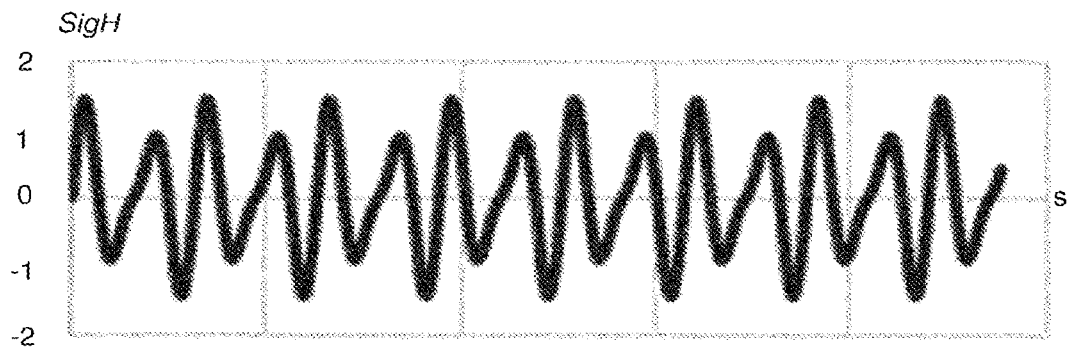
FIGS. 7A-7D show.
Figure 7B:
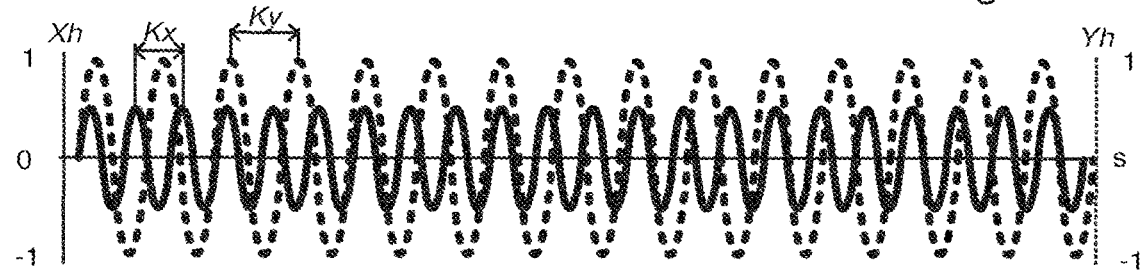
Figure 7C:
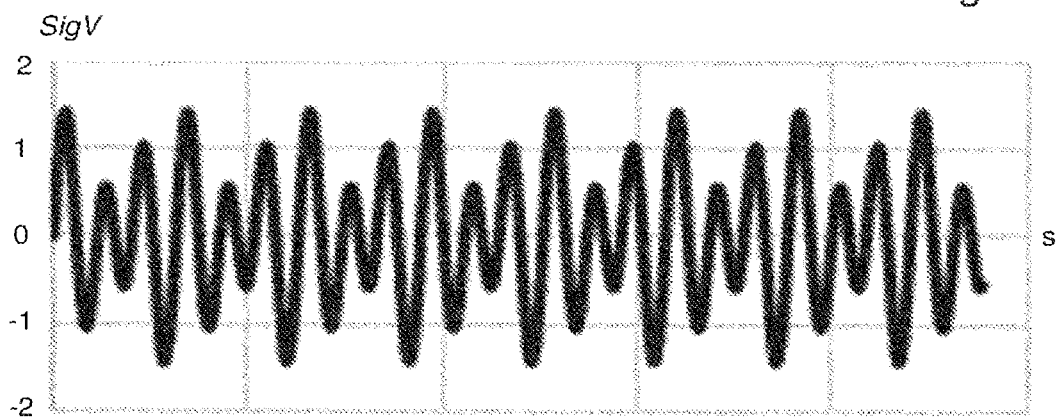
Figure 7D:
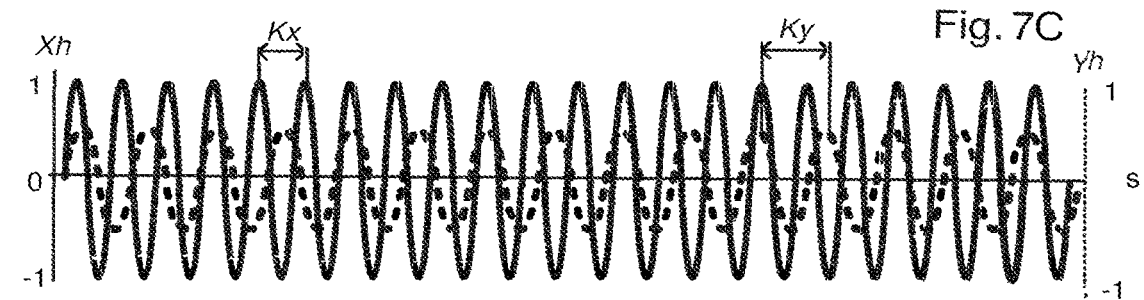

FIG. 7(a) shows the measured signal in the first channel (e.g., H polarized signal) SigH, and FIG. 7(c) shows the measured signal in the second channel (e.g., V polarized signal) SigV. FIG. 7(b) shows the first channel signal SigH of FIG. 7(a) decomposed into X direction signal having a first pitch Kx and a Y direction signal having a second pitch Ky. Similarly, FIG. 7(d) shows the second channel signal SigV of FIG. 7(c) decomposed into X direction signal having the first pitch Kx and a Y direction signal having the second pitch Ky.

For each of the measured signals say SigH, SigV the amplitude of the signal relating to the each of the two detected pitches Kx, Ky is determined:

$$SigV(s) = Xv \cdot \sin(Kx \cdot s) + Yv \cdot \sin(Ky \cdot s) \quad (1)$$

$$SigH(s) = Xh \cdot \sin(Kx \cdot s) + Yh \cdot \sin(Ky \cdot s) \quad (2)$$

where:

s is a position parameter along the scan direction
Kx is the periodicity (in the time scan) of the X-pitch
Ky is the periodicity (in the time scan) of the Y-pitch
Xv is the amplitude of the X pitch for the V polarization sensor signal
Yv is the amplitude of the X pitch for the V polarization sensor signal
Xh is the amplitude of the X pitch for the H polarization sensor signal
Yh is the amplitude of the Y pitch for the H polarization sensor signal As can be seen in FIG. 7, one pitch in each of the channels is dominant due to the target subsegmentation. As such, the subsegmentation helps to separate the Kx pitch signal and Ky pitch signal by increasing the signal of one pitch over that of the other depending on the detection channel of the sensor.

In an embodiment, a signal processing step may be performed to enhance the separation of the two signals. As can be seen in FIG. 7, each channel still comprises some signal from the non-dominant pitch (e.g., the unwanted signal). In this step, it is proposed that the weak pitch in one channel is reduced (e.g., close to zero) by subtracting the strong signal pitch of the other channel. This can be done for both channels.

The signal processing step, is described by Equations (3) and (4); it can be appreciated that the signal for the Y pitch Ky and for the X pitch Kx can be rewritten as:

$$\left(Yv - Yh \cdot \frac{Xv}{Xh}\right) \cdot \sin(Ky \cdot s) = SigV(s) - \frac{Xv}{Xh} \cdot SigH(s) \quad (3)$$

-continued $$\left(Xh - Xv \cdot \frac{Yh}{Yv}\right) \cdot \sin(Kx \cdot s) = SigH(s) - \frac{Yh}{Yv} \cdot SigV(s) \quad (4)$$

This does result in the strong signal pitch also being reduced in signal strength, however this is only in limiting situations, when signal strength is very low, and therefore should not be a problem. For a practical situation in which the ratio of the strong signal to weak signal is in a practical range, the signal loss will be only small. By way of a specific example, if the ratio of signal strength (strong:weak) is only 2:1 (e.g., Xv=1 Yv=2 Xh=2 Yh=1), then:

$$SigV(s) - \frac{1}{2} \cdot SigH(s) = \left(\frac{3}{2}\right) \cdot \sin(Ky \cdot s)$$

$$SigH(s) - \frac{1}{2} \cdot SigV(s) = \left(\frac{3}{2}\right) \cdot \sin(Kx \cdot s)$$

but if the ratio of signal strength (strong:weak) is 3:1 (e.g., Xv=1 Yv=3 Xh=3 Yh=1), then:

$$SigV(s) - \frac{1}{3} \cdot SigH(s) = \left(\frac{8}{3}\right) \cdot \sin(Ky \cdot s)$$

$$SigH(s) - \frac{1}{3} \cdot SigV(s) = \left(\frac{8}{3}\right) \cdot \sin(Kx \cdot s)$$

Note that the method is not restricted to a single color. Also, the methods disclosed herein are not limited to structures which have same printed pitch in X and Y. For example, when the printed physical pitches are at ratio 2:3, the scan could be made at 45 degrees. In fact, it should be appreciated that the methods disclosed herein are not limited to 2D structures and detection at all. The subtraction of a measurement signal in one channel from a measurement signal in another channel may be useful even for 1D grating marks for measurement in one direction.

It is proposed that the concepts described may enable XY detection using underfilled marks from a single scan on a small (e.g., 50×50 μm) mark. Such a method may require only a 12 μm scan length) for sufficient reproducibility.

The present invention can also be characterized by the following clauses:

1. A method of performing a position measurement on an alignment mark comprising at least a first periodic structure having a direction of periodicity along a first direction; the method comprising:
   performing at least one alignment scan of said alignment mark in a direction other than said first direction or a second direction perpendicular said first direction, to obtain simultaneously: a first measurement signal detected in a first measurement channel and a second measurement signal detected in a second measurement channel, the first measurement signal and second measurement signal each relating to scattered radiation, having been scattered by said alignment mark;
   processing the first measurement signal and second measurement signal, said processing comprising subtracting a first direction component of the first measurement signal from a first direction component of the second measurement signal to obtain a first processed signal, the first direction components relating to said first direction; and
   determining a position of an alignment mark with respect to the first direction from the first processed signal.

2. A method as stated in clause 1, wherein the alignment mark further comprises a second periodic structure having a direction of periodicity along said second direction superimposed with the first periodic structure so as to form a two dimensional grid structure; wherein:
   said processing further comprises subtracting a second direction component of the second measurement signal from a second direction component of the first measurement signal to obtain a second processed signal, the second direction components relating to said second direction; and
   said determining a position of the alignment mark further comprises determining a position of the alignment mark with respect to the second direction from the second processed signal.

3. A method as stated in clause 2, wherein, for each measurement signal, the first direction component is differentiated from the second direction component based on signal pitch.

4. A method as stated in clause 2 or 3, wherein said processing the first measurement signal and second measurement signal comprises:
   subtracting the stronger of the components from the first measurement signal from the weaker of the components of the second measurement signal to obtain said first processed signal; and
   subtracting the stronger of the components from the second measurement signal from the weaker of the components of the first measurement signal to obtain said second processed signal.

5. A method as stated in any preceding clause, wherein repeating elements of said first periodic structure are sub-segmented to form sub-periodic structures.

6. A method as stated in any of clause 2 to 4, wherein repeating elements of said first periodic structure and/or second periodic structure are subsegmented to form sub-periodic structures.

7. A method as stated in clause 6, wherein the first periodic structure and of the second periodic structure each comprise the same pitch in said first direction and second direction.

8. A method as stated in clause 7, wherein said alignment scan is performed in one of said first direction and second direction.

9. A method as stated in clause 6, wherein the first periodic structure and of the second periodic structure have different pitches in said first direction and second direction and said alignment scan is performed in a direction such that direction components within said first measurement signal and second measurement signal can be distinguished.

10. A method as stated in any of clauses 6 to 9, wherein the first direction and second direction are respectively parallel with a first coordinate axis and a second coordinate axis of a coordinate system of a substrate comprising the alignment mark.

11. A method as stated in clause 10, wherein a direction of periodicity of the sub-periodic structures is the same as that of the periodic structure it subsegments, at least between crossing points where the repeating elements of the first periodic structure cross the repeating elements of the second periodic structure.

12. A method as stated in clause 10, wherein a direction of periodicity of the sub-periodic structures is perpendicular to that of the periodic structure it subsegments, at least between crossing points where the repeating elements of the first periodic structure cross the repeating elements of the second periodic structure.

13. A method as stated in clause 11 or 12, wherein each of the crossing points comprise sub-periodic structures with directions of periodicity in both the first direction and second direction.

14. A method as stated in clause 11 or 12, wherein crossing points comprise sub-periodic structures with directions of periodicity which alternate between the first direction and second direction in at least one of the first direction and second direction.

15. A method as stated in any of clauses 6 to 9, wherein the direction of periodicity of the sub-periodic structures differs from the first direction and the second direction.

16. A method as stated in clause 15, wherein the first direction and second direction oblique to a first coordinate axis and a second coordinate axis of a coordinate system of the method.

17. A method as stated in clause 16, wherein a direction of periodicity of a first set of the sub-periodic structures is parallel with the first coordinate axis of the coordinate system of a substrate comprising the alignment mark and a direction of periodicity of a second set of the sub-periodic structures is parallel with the second coordinate axis of the coordinate system of the substrate.

18. A method as stated in clause 17, wherein the first set of the sub-periodic structures are comprised within the first periodic structure and the second set of the sub-periodic structures are comprised within the second periodic structure.

19. A method as stated in any preceding clause, wherein a pitch of the sub-periodic structures is smaller than 1 µm.

20. A method as stated in any preceding clause, wherein a pitch of the sub-periodic structures is smaller than 300 nm.

21. A method as stated in any preceding clause, wherein the first measurement channel relates to a first polarization state, first wavelength or first combination thereof of the scattered radiation and the second measurement channel relates to a second polarization state, second wavelength or second combination thereof of the scattered radiation.

22. A method as stated in clause 21, wherein the first measurement channel relates to a first polarization state and the second polarization channel relates to a second polarization state, the first polarization state and second polarization state comprising mutually orthogonal linear polarization states.

23. A method as stated in any preceding clause, comprising the steps of:
   scanning a measurement beam over at least a portion of said alignment mark; and
   detecting said scattered radiation, scattered by the alignment mark, in the first measurement channel and the second measurement channel to obtain said first measurement signal and second measurement signal.

24. A method as stated in any preceding clause, wherein the length of the alignment scan is less than 15 µm.

25. A method as stated in any preceding clause, wherein said at least one alignment scan of said alignment mark comprises a single alignment scan of said alignment mark.

26. A substrate comprising a plurality of alignment marks, each comprising a first periodic structure having a direction of periodicity along a first direction superimposed with a second periodic structure having a direction of periodicity along a second direction so as to form a two dimensional grid structure; and
   wherein repeating elements of said first periodic structure and/or second periodic structure are subsegmented to form sub-periodic structures.

27. A substrate as stated in clause 26, wherein the first direction is perpendicular to the second direction.

28. A substrate as stated in clause 26 or 27, wherein the first periodic structure and of the second periodic structure each comprise the same pitch in said first direction and second direction.

29. A substrate as stated in any of clauses 26 to 28, wherein the first direction and second direction are respectively parallel with a first coordinate axis and a second coordinate axis of a coordinate system of the substrate.

30. A substrate as stated in clause 29, wherein a direction of periodicity of the sub-periodic structures is the same as that of the periodic structure it subsegments, at least between crossing points where the repeating elements of the first periodic structure cross the repeating elements of the second periodic structure.

31. A substrate as stated in clause 29, wherein a direction of periodicity of the sub-periodic structures is perpendicular to that of the periodic structure it subsegments, at least between crossing points where the repeating elements of the first periodic structure cross the repeating elements of the second periodic structure.

32. A substrate as stated in clause 30 or 31, wherein each of the crossing points comprise sub-periodic structures with directions of periodicity in both the first direction and second direction.

33. A substrate as stated in clause 30 or 31, wherein crossing points comprise sub-periodic structures with directions of periodicity which alternate between the first direction and second direction in at least one of the first direction and second direction.

34. A substrate as stated in any of clauses 26 to 28, wherein the direction of periodicity of the sub-periodic structures differs from the first direction and the second direction.

35. A substrate as stated in clause 34, wherein the first direction and second direction are each mutually orthogonal and oblique to a first coordinate axis and a second coordinate axis of a coordinate system of the substrate.

36. A substrate as stated in clause 35, wherein a direction of periodicity of a first set of the sub-periodic structures is parallel with the first coordinate axis of the coordinate system of the substrate and a direction of periodicity of a second set of the sub-periodic structures is parallel with the second coordinate axis of the coordinate system of the substrate.

37. A substrate as stated in clause 36, wherein the first set of the sub-periodic structures are comprised within the first periodic structure and the second set of the sub-periodic structures are comprised within the second periodic structure.

38. A substrate as stated in any preceding clause, wherein a pitch of the sub-periodic structures is smaller than 1 µm.

39. A substrate as stated in any preceding clause, wherein a pitch of the sub-periodic structures is smaller than 300 nm.

40. A patterning device comprising a plurality of patterns for forming alignment marks on a substrate, each pattern being configured such that each alignment mark comprises a first periodic structure having a direction of periodicity along a first direction superimposed with a second periodic structure having a direction of periodicity along a second direction so as to form a two dimensional grid structure; and
   wherein repeating elements of said first periodic structure and second periodic structure are each subsegmented to form sub-periodic structures;

said patterning device being configured to pattern a substrate to obtain the substrate of any of clauses 26 to 39.

41. A patterning device as stated in clause 40, wherein the patterning device comprises no product structures.

42. A computer program comprising computer readable instruction operable to perform at least the processing and determining a position steps of the method of any of clauses 1 to 25.

43. A processor and associated storage medium, said storage medium comprising the computer program of clause 42 such that said processor is operable to perform the method of any of clauses 1 to 25.

44. A metrology device comprising the processor and associated storage medium of clause 43 so as to be operable to perform the method of any of clauses 1 to 25.

45. A lithographic apparatus comprising the metrology device of clause 44.

46. A lithographic apparatus as stated in clause 45, comprising:
   a patterning device support for supporting a patterning device;
   a substrate support for supporting a substrate; and
   wherein the metrology device is operable to determine an aligned position for one or both of the patterning device support and substrate support.

While specific embodiments of the invention have been described above, it will be appreciated that the invention may be practiced otherwise than as described.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method of performing a position measurement on an alignment mark comprising at least a first periodic structure having a direction of periodicity along a first direction; the method comprising:
   performing at least one alignment scan of the alignment mark in a direction other than the first direction or a second direction perpendicular to the first direction to obtain simultaneously: a first measurement signal detected in a first measurement channel and a second measurement signal detected in a second measurement channel, the first measurement signal, and the second measurement signal each relating to scattered radiation, having been scattered by the alignment mark;
   processing the first measurement signal and second measurement signal, the processing comprising subtracting a first direction component of the first measurement signal from a first direction component of the second measurement signal to obtain a first processed signal, the first direction components relating to the first direction; and
   determining a position of the alignment mark with respect to the first direction from the first processed signal.

2. The method of claim 1, wherein the alignment mark further comprises a second periodic structure having a direction of periodicity along the second direction superimposed with the first periodic structure so as to form a two dimensional grid structure,
   wherein the processing further comprises subtracting a second direction component of the second measurement signal from a second direction component of the first measurement signal to obtain a second processed signal, the second direction components relating to the second direction; and
   wherein the determining a position of the alignment mark further comprises determining a position of the alignment mark with respect to the second direction from the second processed signal.

3. The method of claim 2, wherein, for each measurement signal, the first direction component is differentiated from the second direction component based on signal pitch.

4. The method of claim 2, wherein the processing of the first measurement signal and second measurement signal comprises:
   subtracting a strong component of the components from the first measurement signal from a weaker component of the components of the second measurement signal to obtain the first processed signal; and
   subtracting a strong component of the components from the second measurement signal from a weaker component of the components of the first measurement signal to obtain the second processed signal.

5. The method of claim 2, wherein repeating elements of the first periodic structure and/or second periodic structure are subsegmented to form sub-periodic structures.

6. The method of claim 5, wherein the first periodic structure and the second periodic structure each comprise a same pitch in the first direction and second direction.

7. The method of claim 5, wherein the first periodic structure and the second periodic structure have different pitches in the first direction and second direction, and the alignment scan is performed in a direction such that direction components within the first measurement signal and second measurement signal can be distinguished.

8. The method of claim 5, wherein the first direction and second direction are respectively parallel with a first coordinate axis and a second coordinate axis of a coordinate system of a substrate comprising the alignment mark.

9. The method of claim 8, wherein a direction of periodicity of the sub-periodic structures is the same as or is perpendicular to that of the periodic structure it subsegments, at least between crossing points where the repeating elements of the first periodic structure cross the repeating elements of the second periodic structure.

10. The method of claim 9, wherein each of the crossing points comprise sub-periodic structures with directions of periodicity in both the first direction and second direction.

11. The method of claim 9, wherein the crossing points comprise sub-periodic structures with directions of periodicity that alternate between the first direction and second direction in at least one of the first direction and second direction.

12. The method of claim 1, wherein the first measurement channel relates to a first polarization state, first wavelength or first combination thereof of the scattered radiation, and the second measurement channel relates to a second polarization state, second wavelength or second combination thereof of the scattered radiation.

13. The method of claim 12, wherein the first measurement channel relates to the first polarization state and the second measurement channel relates to the second polarization state, the first polarization state and second polarization state comprising mutually orthogonal linear polarization states.

14. The method of claim 1, comprising:
scanning a measurement beam over at least a portion of the alignment mark; and
detecting the scattered radiation, scattered by the alignment mark, in the first measurement channel and the second measurement channel to obtain the first measurement signal and second measurement signal.

15. The method of claim 1, wherein the at least one alignment scan of the alignment mark comprises a single alignment scan of the alignment mark.

16. A non-transitory computer program product comprising machine-readable instructions for causing a processor to cause performance of a method of performing a position measurement on an alignment mark comprising at least a first periodic structure having a direction of periodicity along a first direction, the method comprising:
performing at least one alignment scan of the alignment mark in a direction other than the first direction or a second direction perpendicular to the first direction to obtain simultaneously:
a first measurement signal detected in a first measurement channel and
a second measurement signal detected in a second measurement channel,
the first measurement signal, and the second measurement signal each relating to scattered radiation, having been scattered by the alignment mark;
processing the first measurement signal and second measurement signal, the processing comprising subtracting a first direction component of the first measurement signal from a first direction component of the second measurement signal to obtain a first processed signal, the first direction components relating to the first direction; and
determining a position of the alignment mark with respect to the first direction from the first processed signal.

17. A processor and an associated non-transitory computer program product storage medium, the storage medium comprising the computer program of claim 16.

18. A metrology device comprising the processor and associated non-transitory computer program product storage medium of claim 17.

19. A lithographic apparatus comprising the metrology device of claim 18.

20. The lithographic apparatus of claim 19, comprising:
a patterning device support for supporting a patterning device; and
a substrate support for supporting a substrate,
wherein the metrology device is operable to determine an aligned position for one or both of the patterning device support and the substrate support.

* * * * *

UNITED STATES PATENT AND TRADEMARK OFFICE
CERTIFICATE OF CORRECTION

| | |
|---|---|
| PATENT NO. | : 11,927,892 B2 |
| APPLICATION NO. | : 17/784424 |
| DATED | : March 12, 2024 |
| INVENTOR(S) | : Bijnen et al. |

It is certified that error appears in the above-identified patent and that said Letters Patent is hereby corrected as shown below:

In the Claims

In Column 18, Claim 17, Line 23, after "program", insert -- product --.

Signed and Sealed this
Sixteenth Day of April, 2024

Katherine Kelly Vidal
*Director of the United States Patent and Trademark Office*